(12) United States Patent
Lin

(10) Patent No.: US 12,170,129 B2
(45) Date of Patent: Dec. 17, 2024

(54) DATA RECEIVING CIRCUIT, DATA RECEIVING SYSTEM AND STORAGE DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 166 days.

(21) Appl. No.: 17/953,413

(22) Filed: Sep. 27, 2022

(65) Prior Publication Data
US 2023/0023730 A1 Jan. 26, 2023

Related U.S. Application Data

(63) Continuation of application No. PCT/CN2022/105291, filed on Jul. 12, 2022.

(30) Foreign Application Priority Data

Jun. 23, 2022 (CN) .......................... 202210726556.3

(51) Int. Cl.
*G11C 7/22* (2006.01)
*G11C 7/10* (2006.01)

(52) U.S. Cl.
CPC ............ *G11C 7/222* (2013.01); *G11C 7/1048* (2013.01); *G11C 7/109* (2013.01)

(58) Field of Classification Search
CPC ....... G11C 7/222; G11C 7/1048; G11C 7/109; G11C 7/1057; G11C 7/106; G11C 7/1084;
(Continued)

(56) References Cited

U.S. PATENT DOCUMENTS 7,233,616 B1 6/2007 Nayler
8,149,953 B2 4/2012 Kim et al.
(Continued)

FOREIGN PATENT DOCUMENTS

CN 1913505 A 2/2007
CN 100401269 C 7/2008
(Continued)

OTHER PUBLICATIONS

European Patent Office, Extended European Search Report Issued in U.S. Appl. No. 22/792,738, filed Apr. 23, 2024, Germany, 10 pages.
(Continued)

*Primary Examiner* — Huan Hoang
(74) *Attorney, Agent, or Firm* — Kilpatrick Townsend & Stockton LLP

(57) ABSTRACT

A data receiving circuit includes: a first amplification module configured to receive a data signal and a reference signal, compare the data signal and the reference signal in response to a first sampling clock signal, and output a first voltage signal and a second voltage signal; a decision feedback control module configured to generate a second sampling clock signal in response to the enable signal; a decision feedback equalization module configured to, when the enable signal is in a first level value interval, perform decision feedback equalization in response to the second sampling clock signal and stop performing the decision feedback equalization when the enable signal is in a second level value interval; and a second amplification module configured to process the first voltage signal and the second voltage signal and output the first output signal and the second output signal.

20 Claims, 8 Drawing Sheets

(58) Field of Classification Search
CPC .. G11C 2207/2254; G11C 7/1087; G11C 7/22; H04L 25/03267
USPC .................................................... 365/233.1
See application file for complete search history.

(56) References Cited

U.S. PATENT DOCUMENTS

| | | |
|---|---|---|
| 10,825,493 B2 | 11/2020 | Karim |
| 11,388,030 B2 | 7/2022 | Hu |
| 2008/0089155 A1 | 4/2008 | Bae |
| 2009/0058476 A1 | 3/2009 | Oh et al. |
| 2009/0128214 A1 | 5/2009 | Kim et al. |
| 2009/0129459 A1 | 5/2009 | Kim |
| 2010/0327924 A1 | 12/2010 | Hasegawa et al. |
| 2012/0027074 A1 | 2/2012 | Raghavan et al. |
| 2012/0063242 A1 | 3/2012 | Kim et al. |
| 2013/0107933 A1 | 5/2013 | Hu et al. |
| 2013/0107935 A1 | 5/2013 | Zhou et al. |
| 2015/0312060 A1 | 10/2015 | Sinha |
| 2017/0187361 A1* | 6/2017 | Tai .................. H03L 7/0807 |
| 2018/0351770 A1 | 12/2018 | Chiu et al. |
| 2019/0068412 A1 | 2/2019 | Hsieh et al. |
| 2020/0358590 A1 | 11/2020 | Kim |
| 2021/0174844 A1 | 6/2021 | Choi |
| 2021/0266201 A1 | 8/2021 | Hu |
| 2022/0028434 A1 | 1/2022 | Choi |
| 2022/0077830 A1 | 3/2022 | Duan |
| 2022/0141054 A1 | 5/2022 | Seong |
| 2022/0263690 A1 | 8/2022 | Hu |
| 2024/0129167 A1 | 4/2024 | Tsai et al. |

FOREIGN PATENT DOCUMENTS

| | | |
|---|---|---|
| CN | 111159081 A | 5/2020 |
| CN | 111916123 A | 11/2020 |
| CN | 112332818 A | 2/2021 |
| CN | 112753071 A | 5/2021 |
| CN | 113129987 A | 7/2021 |
| CN | 113517011 A | 10/2021 |
| CN | 113556104 A | 10/2021 |
| EP | 3929926 A1 | 12/2021 |
| KR | 20090044055 A | 5/2009 |
| KR | 20220107002 A | 8/2022 |
| TW | I409635 B | 9/2013 |

OTHER PUBLICATIONS

First Office Action of the Taiwanese application No. 111142520, issued on Sep. 28, 2023, 7 pages with English abstract.
First Office Action of the Korean application No. 10-2022-7035492, issued on Sep. 11, 2023, 13 pages with English translation.
International Search Report in the international application No. PCT/CN2022/115546, mailed on Jan. 18, 2023, 4 pages.
International Search Report in the international application No. PCT/CN2022/105291, mailed on Dec. 19, 2022, 4 pages.
Japanese Patent Office, Office Action Issued in Application No. 2022-562529, Aug. 6, 2024, 12 pages.
United States Patent and Trademark office, Non-Final Office action issued in U.S. Appl. No. 18/152,919 on Sep. 16, 2024.

* cited by examiner

DATA RECEIVING CIRCUIT, DATA RECEIVING SYSTEM AND STORAGE DEVICE

CROSS-REFERENCE TO RELATED APPLICATIONS

The application is a continuation of International Application No. PCT/CN2022/105291, filed on Jul. 12, 2022, which claims priority to Chinese Patent Application No. 202210726556.3, filed on Jun. 23, 2022. The disclosures of International Application No. PCT/CN2022/105291 and Chinese Patent Application No. 202210726556.3 are hereby incorporated by reference in their entireties.

BACKGROUND

In memory applications, as the speed of signal transmission becomes increasingly faster, the channel loss has increasingly greater influence on the signal quality, which will easily lead to inter-symbol interference (ISI). At present, an equalization circuit is usually used for compensating the channel, and a Continuous Time Linear Equalizer (CTLE) or Decision Feedback Equalizer (DFE) can be selected as the equalization circuit.

However, although the addition of the equalization circuit can compensate the signal, the addition of the equalization circuit in a data receiving circuit will increase the overall power consumption of the data receiving circuit.

SUMMARY

The embodiments of the disclosure relate to the technical field of semiconductors, in particular, to a data receiving circuit, a data receiving system and a storage device.

The embodiments of the present disclosure provide a data receiving circuit, a data receiving system and a storage device, which are at least favorable for improving the reception performance of the data receiving circuit and simultaneously reducing the power consumption of the data receiving circuit.

An aspect of embodiments of the present disclosure provides a data receiving circuit including: a first amplification module, configured to receive a data signal and a reference signal, compare the data signal and the reference signal in response to a first sampling clock signal, and output a first voltage signal and a second voltage signal respectively through a first node and a second node; a decision feedback control module, configured to generate a second sampling clock signal in response to an enable signal; a decision feedback equalization module, connected to the first node and the second node. The decision feedback equalization module is configured to, when the enable signal is in a first level value interval, perform decision feedback equalization in response to the second sampling clock signal and based on a feedback signal to adjust the first voltage signal and the second voltage signal, and stop performing the decision feedback equalization when the enable signal is in a second level value interval, the feedback signal being obtained based on previously received data; and a second amplification module, configured to amplify a voltage difference between the first voltage signal and the second voltage signal, and output a first output signal and a second output signal respectively through a third node and a fourth node.

According to some embodiments of the present disclosure, another aspect of the disclosed embodiments also provides a data receiving system including multiple cascaded stages of data transmission circuits, where each of the data transmission circuits includes the data receiving circuit of any one of preceding embodiments and a latch circuit connected to the data receiving circuit, each of the data receiving circuits is connected to a data port to receive the data signal; the data transmission circuit of a preceding stage is connected to the decision feedback equalization module of the data transmission circuit of a following stage, and the output of the data transmission circuit of the preceding stage serves as a feedback signal of the decision feedback equalization module of the data transmission circuit of the following stage; and the data transmission circuit of a last stage is connected to the decision feedback equalization module of the data transmission circuit of a first stage, and an output of the data transmission circuit of the last stage serves as a feedback signal of the decision feedback equalization module of the data transmission circuit of the first stage.

BRIEF DESCRIPTION OF THE DRAWINGS

One or more embodiments are exemplarily illustrated by the corresponding drawings. These exemplary descriptions do not limit the embodiments. Unless otherwise stated, the pictures in the drawings do not limit the scale. In order to describe the technical solutions of the embodiments of the present disclosure more clearly, drawings required to be used in the embodiments of the present disclosure will be briefly introduced below. Apparently, the drawings described below are only some embodiments of the present disclosure. Those of ordinary skill in the art also can obtain other drawings according to these drawings without doing creative work.

DETAILED DESCRIPTION

Figure 1:
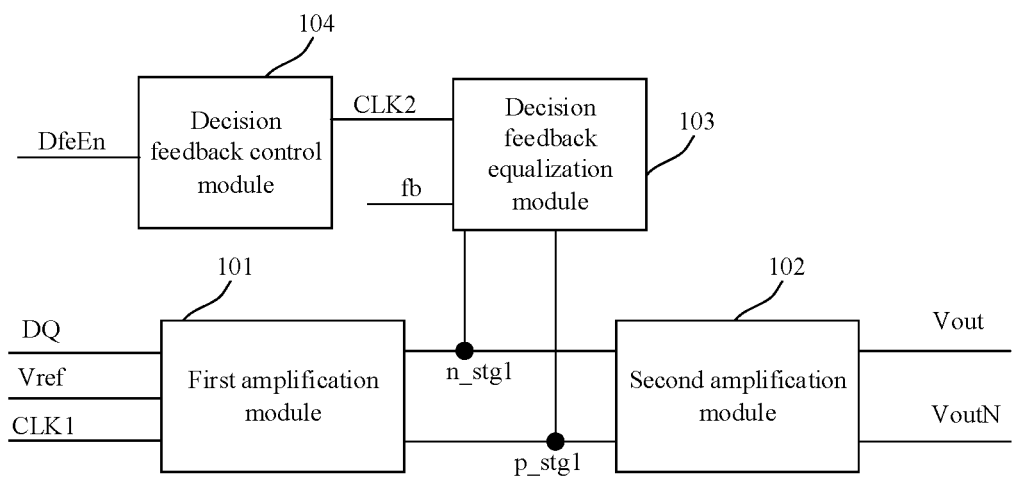
FIG. 1 is a functional block diagram of a data receiving circuit according to an embodiment of the present disclosure.

The embodiments of the present disclosure provide a data receiving circuit, a data receiving system and a storage device. In the data receiving circuit, the decision feedback control module and the decision feedback equalization module are integrated into the data receiving circuit, and the decision feedback control module is used to generate a second sampling clock signal for controlling the decision feedback equalization module, so as to flexibly control whether the decision feedback equalization module is to be in an operating state. For example, when it is necessary to reduce the influence of ISI on the data receiving circuit, i.e., when the enable signal is in the first level value interval, the decision feedback equalization module is controlled to perform the decision feedback equalization based on the second sampling clock signal outputted by the decision feedback control module, so as to improve the reception performance of the data receiving circuit; and when the influence of ISI on data receiving circuit is not required to be considered, i.e., when the enable signal is in the second level value interval, the decision feedback equalization module is controlled to stop based on the second sampling clock signal outputted by the decision feedback control module, performing the decision feedback equalization, so as to reduce the overall power consumption of the data receiving circuit. In this way, it is possible to facilitate improving the reception performance of the data receiving circuit and simultaneously reducing the overall power consumption of the data receiving circuit.

The technical schemes provided by the embodiments of the disclosure have at least the following advantages.

The decision feedback control module and the decision feedback equalization module are integrated into the data receiving circuit, and the decision feedback control module is used to generate a second sampling clock signal for controlling the decision feedback equalization module, so as to flexibly control whether the decision feedback equalization module is to be in an operating state. For example, the decision feedback equalization module performs the decision feedback equalization only when the enable signal is in a first level value interval, so as to improve the reception performance of the data receiving circuit; and the decision feedback equalization module stops performing the decision feedback equalization when the enable signal is in a second level value interval, i.e., the decision feedback equalization module is made to be in a non-operating state so as to reduce the overall power consumption of the data receiving circuit.

The first output signal and the second output signal are adjusted by the decision feedback equalization module, to reduce the influence of ISI on data reception, compared with related art where the storage device separately arranges a decision feedback equalizer to reduce the ISI, embodiments of the present disclosure facilitate the adjustment of signals outputted by the data receiving circuit by using a smaller circuit layout area and a lower power consumption, and by flexibly controlling the ability of adjustment of the first output signal and the second output signal by the decision feedback equalization module, the influence of the ISI of the data received by the data receiving circuit on the data receiving circuit is reduced to improve the reception performance of the data receiving circuit, and to reduce the influence of the ISI of the data on the accuracy of the signal outputted by the data receiving circuit.

Embodiments of the present disclosure will now be described in detail in conjunction with the accompanying drawings. However, those of ordinary skill in the art will appreciate that, in various embodiments of the present disclosure, many technical details have been proposed to better enable the reader to understand the present disclosure. However, the technical solution claimed in the present disclosure can be implemented without these technical details and various changes and modifications based on the following embodiments.

Figure 3:
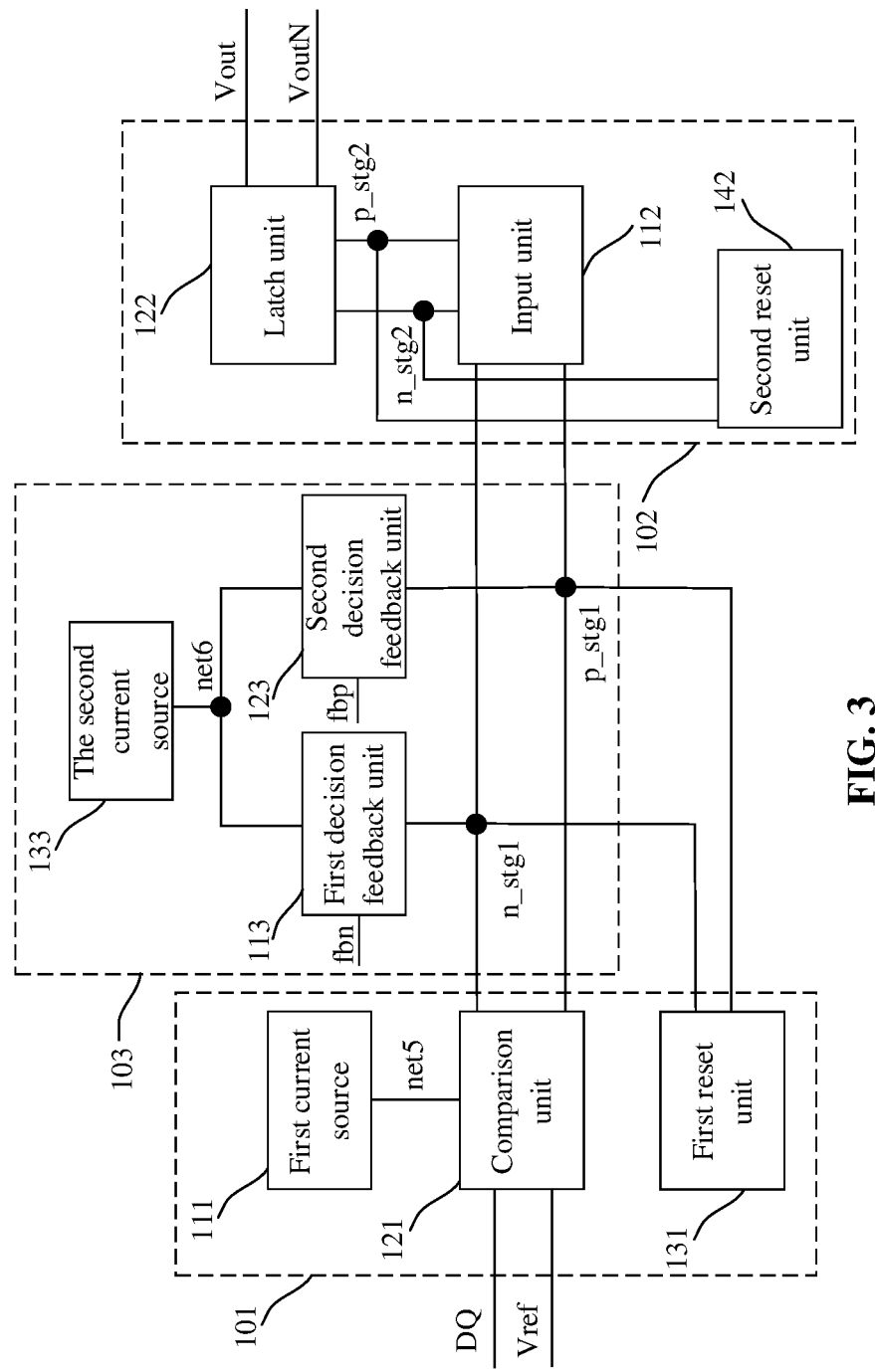
FIG. 3 to FIG. 4 are other two functional block diagrams of a data receiving circuit according to embodiments of the present disclosure.
Figure 4:
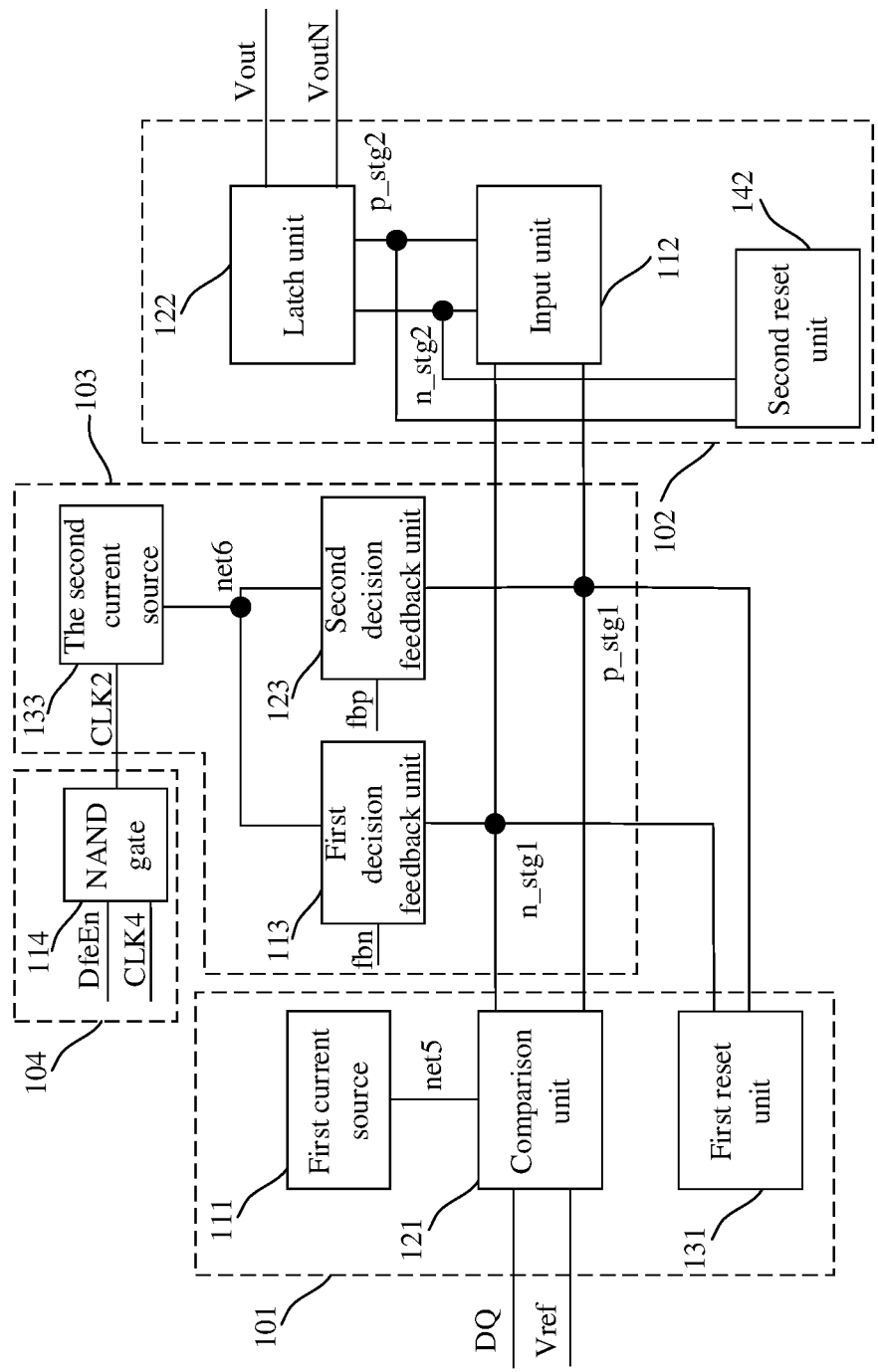
Figure 5:
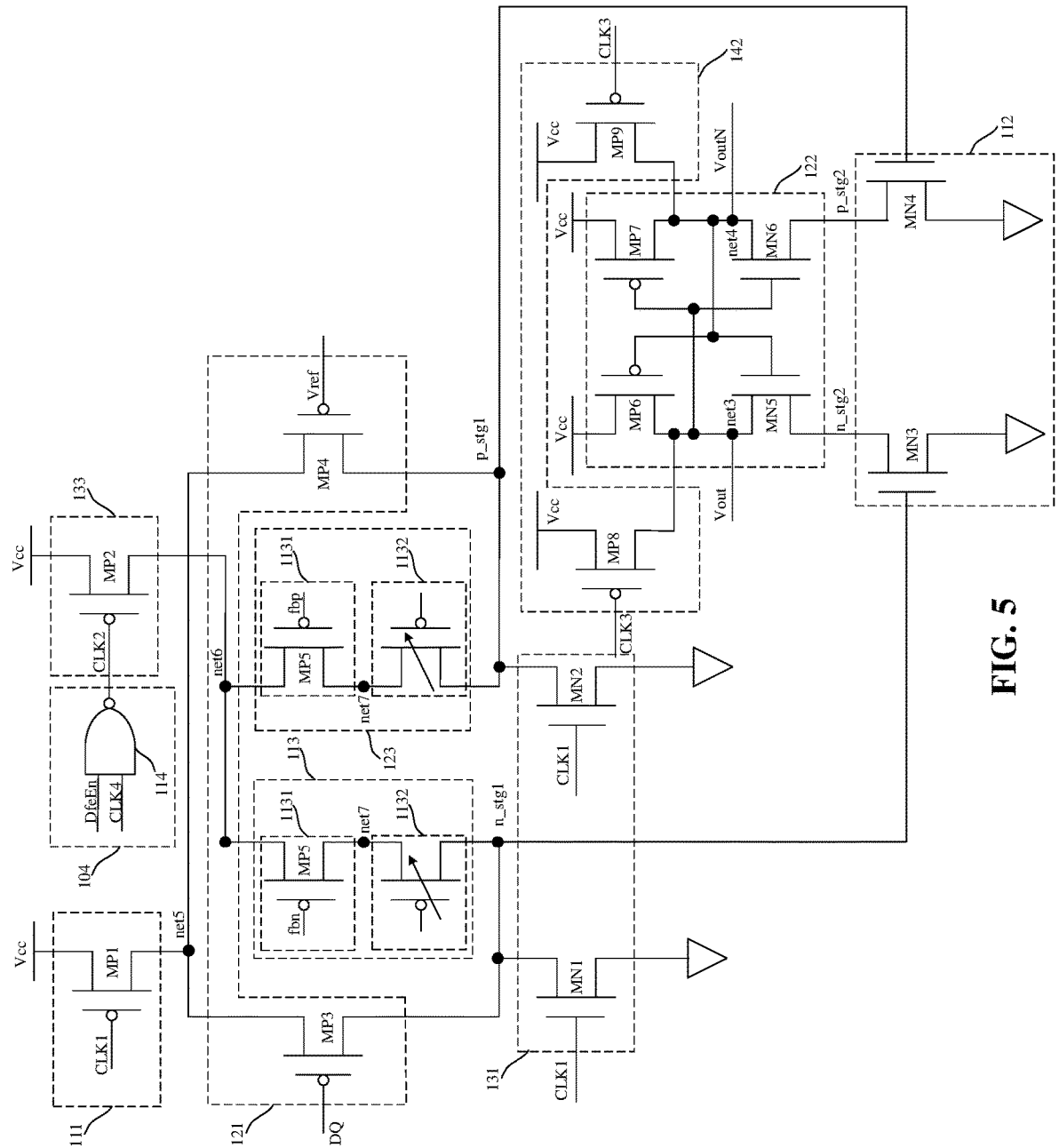
FIG. 5 is a schematic structural diagram of a data receiving circuit according to an embodiment of the present disclosure.
Figure 6:
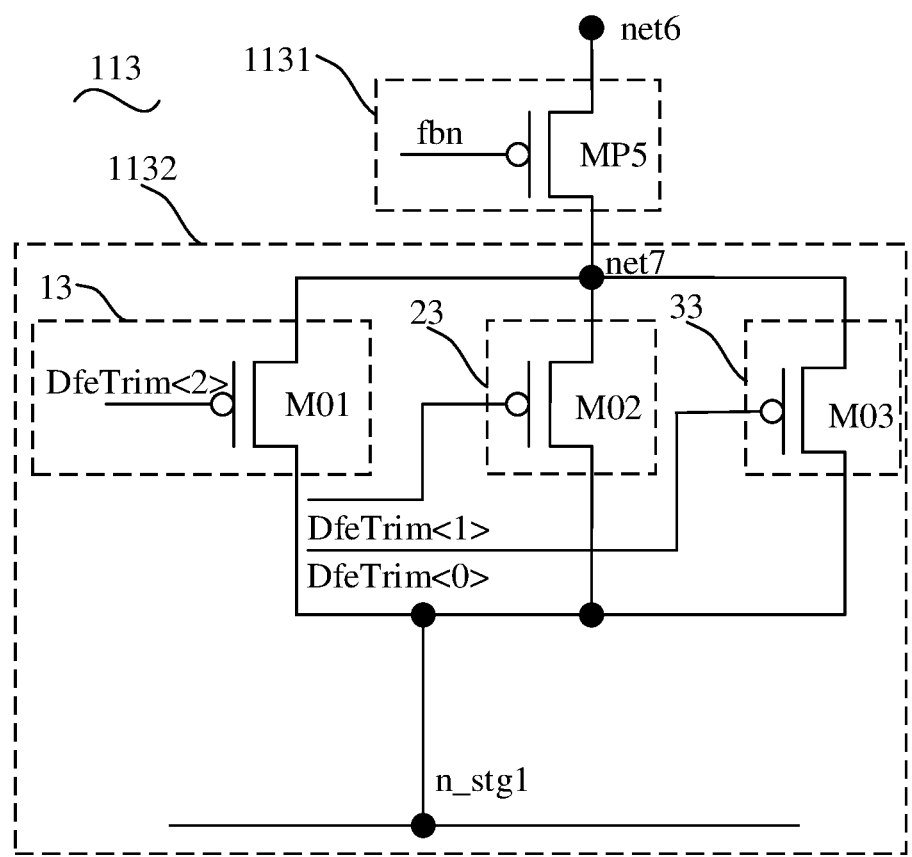
FIG. 6 to FIG. 7 are schematic structural diagrams a first decision feedback unit in a data receiving circuit according to an embodiment of the present disclosure.
Figure 7:
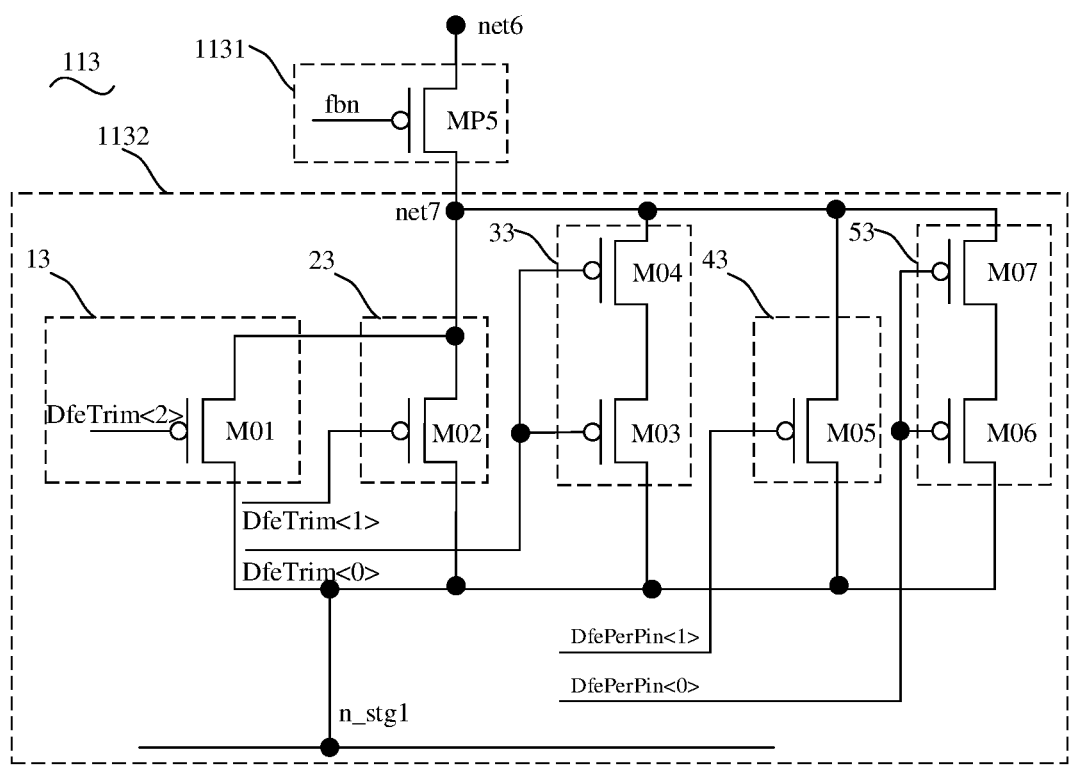
Figure 8:
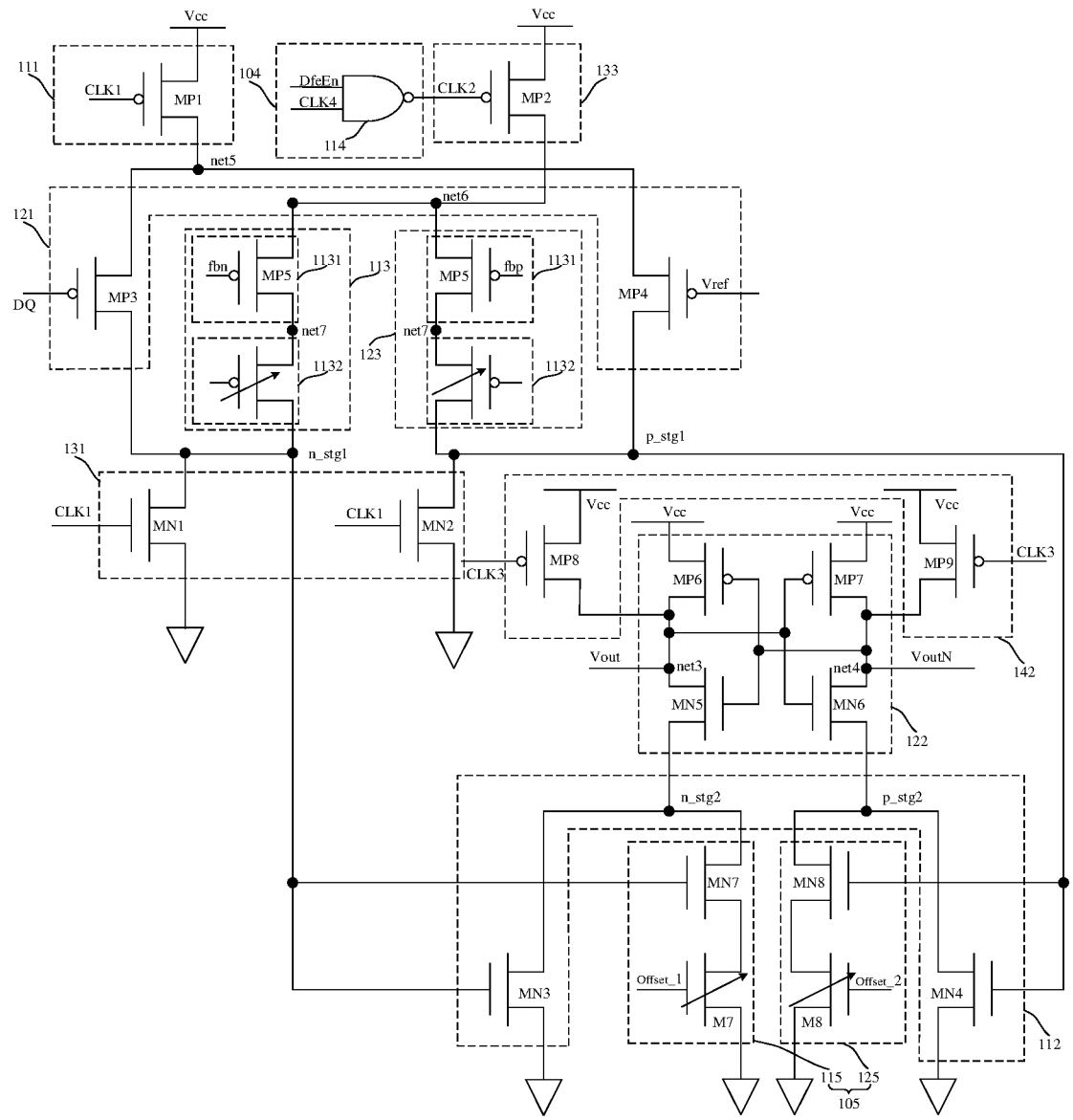
FIG. 8 is another schematic structural diagram of a data receiving circuit according to an embodiment of the present disclosure.

An embodiment of the present disclosure provides a data receiving circuit, and the data receiving circuit provided by the embodiment of the present disclosure will be described in detail with reference to the accompanying drawings. FIG. 1 is a functional block diagram of a data receiving circuit provided by an embodiment of the present disclosure. FIG. 3 to FIG. 4 are other two functional block diagrams of a data receiving circuit provided by embodiments of the present disclosure. FIG. 5 is a schematic structural diagram of a data receiving circuit provided by an embodiment of the present disclosure. FIG. 6 to FIG. 7 are schematic structural diagram of a first decision feedback unit in a data receiving circuit provided by an embodiment of the present disclosure. FIG. 8 is another schematic structural diagram of a data receiving circuit provided by an embodiment of the present disclosure.

With reference to FIG. 1, a data receiving circuit 100 includes a first amplification module 101, a decision feedback control module 104, a decision feedback equalization module 103 and a second amplification module 102. The first amplification module 101 is configured to receive a data signal DQ and a reference signal Vref, compare the data signal DQ and the reference signal Vref in response to a first sampling clock signal CLK1, and output a first voltage signal and a second voltage signal respectively through a first node n_stg1 and a second node p_stg1. The decision feedback control module 104 is configured to generate a second sampling clock signal CLK2 in response to an enable signal DfeEn. The decision feedback equalization module 103 is connected to the first node n_stg1 and the second node p_stg1, and configured to, when the enable signal DfeEn is in a first level value interval, perform decision feedback equalization in response to the second sampling clock signal CLK2 and based on a feedback signal fb to adjust the first voltage signal and the second voltage signal, and stops performing the decision feedback equalization when the enable signal DfeEn is in a second level value interval. The feedback signal is obtained based on previously received. The second amplification module 102 is configured to amplify a voltage difference between the first voltage signal and the second voltage signal, and to output a first output signal Vout and a second output signal VoutN respectively through a third node net3 (with reference to FIG. 5) and a fourth node net4 (with reference to FIG. 5).

It should be noted that the data receiving circuit 100 adopts two stages of amplification modules, e.g., the first amplification module 101 and the second amplification module 102, to process the data signal DQ and the reference signal Vref. In this way, it is possible to facilitate enhancing the amplification capability of the data receiving circuit 100, and increasing the voltage amplitudes of the first output signal Vout and the second output signal VoutN, so as to facilitate the processing of subsequent circuits.

In addition, the decision feedback control module 104 is used to generate a second sampling clock signal CLK2 for controlling the decision feedback equalization module 103, so as to flexibly control whether the decision feedback equalization module 103 is to be in the operating state. For example, when it is necessary to reduce the influence of ISI on the data receiving circuit 100, i.e., when the enable signal DfeEn is in the first level value interval, the decision feedback control module 104 generates the second sampling clock signal CLK2 in response to the enable signal DfeEn at this time, and the decision feedback equalization module 103 performs decision feedback equalization based on the second sampling clock signal CLK2, so as to improve the reception performance of the data receiving circuit 100. When the influence of the ISI on the data receiving circuit 100 is not required to be considered, i.e., when the enable signal DfeEn is in the second level value interval, the decision feedback equalization module 103 stops, based on the second sampling clock signal CLK2 at this time, performing the decision feedback equalization, so as to reduce the overall power consumption of the data receiving circuit 100. In this way, it is possible to facilitate improving the reception performance of the data receiving circuit 100 and simultaneously reducing the overall power consumption of the data receiving circuit 100.

The integration of the decision feedback equalization module 103 into the data receiving circuit 100 facilitates the adjustment of the signal outputted by the data receiving circuit 100 by using a smaller circuit layout area and a lower power consumption. Furthermore, adjustment capability, for adjusting the first output signal Vout and the second output signal VoutN, of the decision feedback equalization module 103 provided in the embodiment of the present disclosure is adjustable, it can be appreciated that, When the data signal DQ and/or the reference signal Vref received by the data receiving circuit 100 change, the ability for adjusting the first output signal Vout and the second output signal VoutN by the decision feedback equalization module 103 can be flexibly controlled, so as to reduce the influence of the ISI of the data received by the data receiving circuit 100 on the data receiving circuit 100, improve the reception performance of the data receiving circuit 100, and reduce the influence of the ISI of the data on the accuracy of the signal outputted by the data receiving circuit 100.

In some embodiments, with reference to FIG. 3 the first amplification module 101 may include a first current source 111 configured to be connected between the power supply node Vcc (with reference to FIG. 5) and the fifth node net5 to supply current to the fifth node net5 in response to the first sampling clock signal CLK1; a comparison unit 121, connected the fifth node net5, the first node n_stg1 and the second node p_stg1, is the comparison unit 121 is configured to receive the data signal DQ and the reference signal Vref, compare the data signal DQ and the reference signal Vref when the first current source 111 supplies the current to the fifth node net5 in response to the first sampling clock signal CLK1, output the first voltage signal through the first node n_stg1 and output the second voltage signal through the second node p_stg1.

It can be appreciated that the comparison unit 121 may control the difference between the current supplied to the first node n_stg1 and the current supplied to the second node p_stg1 based on the difference between the data signal DQ and the reference signal Vref to output the first voltage signal and the second voltage signal.

The first amplification module 101 is described in detail below with reference to FIG. 5 and FIG. 8.

In some embodiments, with reference to FIG. 5 and FIG. 8, the first current source 111 may include a first PMOS transistor MP1 connected between the power supply node Vcc and the fifth node net5, and having a gate configured to receive the first sampling clock signal CLK1. When the first sampling clock signal CLK1 is at a low level, the gate of the first PMOS transistor MP1 receives the first sampling clock signal CLK1 to be turned on, the current is supplied to the fifth node net5, so that the comparison unit 121 is in an operating state, and compares the received data signal DQ with the reference signal Vref.

In some embodiments, with continued reference to FIG. 5 and FIG. 8, the comparison unit 121 may include a third PMOS transistor MP3 connected between the fifth node net5 and the first node n_stg1 and having a gate configured to receive the data signal DQ; and a fourth PMOS transistor MP4 connected between the fifth node net5 and the second node p_stg1 and having a gate configured to receive a reference signal Vref.

It should be noted that the level changes of the data signal DQ and the reference signal Vref are not synchronized, so that the time when the third PMOS transistor MP3 configured to receive the data signal DQ is turned on is different from the time when the fourth PMOS transistor MP4 configured to receive the reference signal Vref is turned on, and at the same time, the extent to which the third PMOS transistor MP3 is turned on is different from the extent to which the fourth PMOS transistor MP4 is turned on. It can be appreciated that, based on the fact that the extent of turning on of the third PMOS transistor MP3 is different from that of the fourth PMOS transistor MP4, the third PMOS transistor MP3 and the fourth PMOS transistor MP4 have different shunt capabilities for the current at the fifth node net5, such that the voltage at the first node n_stg1 is different from the voltage at the second node p_stg1.

In one example, when the level value of the data signal DQ is lower than the level value of the reference signal Vref, the extent of turning on of the third PMOS transistor MP3 is greater than that of the fourth PMOS transistor MP4, and the current at the fifth node net5 flow more into the path where the third PMOS transistor MP3 is located, so that the current at the first node n_stg1 is greater than the current at the second node p_stg1, thereby further making the level value of the first voltage signal outputted by the first node n_stg1 to be high and the level value of the second voltage signal outputted by the second node p_stg1 to be low.

In some embodiments, with reference to FIG. 3 and FIG. 4, the first amplification module 101 may further include a first reset unit 131 connected to the first node n_stg1 and the second node p_stg1 and configured to reset the first node n_stg1 and the second node p_stg1. In this way, after the data receiving circuit completes the reception of the data signal DQ and the reference signal Vref and the output of the first output signal Vout and the second output signal VoutN once, the level values at the first node n_stg1 and the second node p_stg1 can be restored to the initial values by the first reset unit 131 so as to facilitate the next data reception and subsequent processing by the data receiving circuit.

In some embodiments, with reference to FIG. 5 and FIG. 8, the first reset unit 131 may include a first NMOS transistor MN1 connected between the first node n_stg1 and the ground terminal and having a gate configured to receive the first sampling clock signal CLK1; a second NMOS transistor MN2 connected between the second node p_stg1 and the ground terminal and having a gate configured to receive a first sampling clock signal CLK1.

In one example, when the first sampling clock signal CLK1 is at a low level, the first PMOS transistor MP1 is turned on, and the first NMOS transistor MN1 and the second NMOS transistor MN2 are both turned off to ensure the normal operation of the data receiving circuit, moreover, the first NMOS transistor MN1 and the second NMOS transistor MN2 can be used as loads of the first amplification module 101 to increase the amplification gain of the first amplification module 101. When the first sampling clock signal CLK1 is at a high level, the first PMOS transistor MP1 is turned off, while the first NMOS transistor MN1 and the second NMOS transistor MN2 are both turned on, and the voltage at the first node n_stg1 and the voltage at the second node p_stg1 are pulled down to implement the reset of the first node n_stg1 and the second node p_stg1.

In some embodiments, with reference to FIG. 3 and FIG. 4, the feedback signal fb includes a first feedback signal fbn and a second feedback signal fbp that are differential signals to each other. The decision feedback equalization module 103 may include a second current source 133 configured to be connected between the power supply node Vcc (with reference to FIG. 5) and the sixth node net6 to supply current to the sixth node net6 in response to the second sampling clock signal CLK2; a first decision feedback unit 113 connected the first node n_stg1 and the sixth node net6 and configured to perform decision feedback equalization on the first node n_stg1 based on the first feedback signal fbn to adjust the first voltage signal, when the second current source 133 supplies a current to the sixth node net6 in response to the second sampling clock signal CLK2; and a second decision feedback unit 123 connected the second node p_stg1 and the sixth node net6 and configured to perform decision feedback equalization on the second node p_stg1 based on the second feedback signal fbp to adjust the second voltage signal when the second current source 133 supplies the current to the sixth node net6 in response to the second sampling clock signal CLK2.

It can be appreciated that, the current source in the first amplification module 101 is a first current source 111, the current source in the decision feedback equalization module 103 is the second current source 133. It can be seen that different current sources are used for respectively supplying currents to the first amplification module 101 and the decision feedback equalization module 103, so that the decision feedback equalization module 103 has an independent second current source 133, so as to independently control whether the decision feedback equalization module 103 is to be in an operating state.

The second sampling clock signal CLK2 is controlled by the enable signal DfeEn, and when the enable signal DfeEn is in the first level value interval, the second current source 133 supplies a current to the sixth node net 6 in response to the second sampling clock signal CLK2 at this time, so that the first decision feedback unit 113 can perform decision feedback equalization on the first node n_stg1 based on the received first feedback signal fbn to adjust the first voltage signal, and at this time, the second decision feedback unit 123 can perform decision feedback equalization on the second node p_stg1 based on the received second feedback signal fbp to adjust the second voltage signal. In this way, when the enable signal DfeEn is in the first level value interval, the decision feedback equalization module 103 performs decision feedback equalization in response to the second sampling clock signal CLK2 and based on the feedback signal fb, to adjust the first voltage signal and the second voltage signal.

When the enable signal DfeEn is in a second level value interval, the second current source 133 is in an off state in response to the second sampling clock signal CLK2 at this time, that is, no current is supplied to the sixth node net 6, and no current passes through either the first decision feedback unit 113 or the second decision feedback unit 123, so that the decision feedback equalization module 103 stops performing the decision feedback equalization and the overall power consumption of the data receiving circuit 100 is reduced.

The first decision feedback unit 113 is used for adjusting the current in the third PMOS transistor MP3 to adjust the voltage at the first node n_stg1, which is equivalent to adjusting the data signal DQ, and the second decision feedback unit 123 is used for adjusting the current in the fourth PMOS transistor MP4 to adjust the voltage at the second node p_stg1, which is equivalent to adjusting the reference signal Vref.

It should be noted that, the second amplification module 102 receives the first voltage signal and the second voltage signal and amplifies the voltage difference between the first voltage signal and the second voltage signal, to output a first output signal Vout and a second output signal VoutN. That is to say, the first output signal Vout and the second output signal VoutN are affected by the first voltage signal and the second voltage signal, and the decision feedback equalization module 103 adjusts the first voltage signal and the second voltage signal based on the feedback signal fb, and may further adjust the first output signal Vout and the second output signal VoutN. Furthermore, the adjustment of the first voltage signal and the second voltage signal by the decision feedback equalization module 103 will be described in detail with reference to a specific circuit diagram.

In some embodiments, with reference to FIG. 5 and FIG. 8, the second current source 133 may include a second PMOS transistor MP2 connected between the power supply node Vcc and the sixth node net6 and having a gate configured to receive the second sampling clock signal CLK2.

In one example, when the enable signal DfeEn is in a first level value interval, the decision feedback control module 104 generates a second sampling clock signal CLK2 in response to the enable signal DfeEn, when the second sampling clock signal CLK2 is at a low level, the gate of the second PMOS transistor MP2 receives the second sampling clock signal CLK2 at this time and is turned on, so as to supply a current to the sixth node net6 and cause the decision feedback equalization module 103 to perform decision feedback equalization in response to the second sampling clock signal CLK2 at this time and based on the feedback signal fb to adjust and the second voltage signal. When the enable signal DfeEn is in a second level value interval, the second sampling clock signal CLK2 generated by the decision feedback control module 104 in response to the enable signal DfeEn at this time is always high, the gate of the second PMOS transistor MP2 receives the second sampling clock signal CLK2 at this time and is turned off, then no current is supplied to the sixth node net6, so that the decision feedback equalization module 103 stops performing the decision feedback equalization so as to reduce the overall power consumption of the data receiving circuit 100.

In some embodiments, with continued reference to FIG. 5 and FIG. 8, the decision feedback control module 104 may include a NAND gate circuit 114 having one input terminal configured to receive the fourth sampling clock signal CLK4, another input terminal configured to receive the enable signal DfeEn, and an output terminal configured to output the second sampling clock signal CLK2.

It should be noted that, in one example, the first level value interval of the enable signal DfeEn refers to a level value range that causes the decision feedback control module 104 to determine that the enable signal DfeEn is at a logic level 1, i.e., a high level, the second level value interval of the enable signal DfeEn refers to a level value range that causes the decision feedback control module 104 to determine that the enable signal DfeEn is at a logic level 0, i.e., a low level.

In one example, when it is necessary to reduce the influence of ISI on the data receiving circuit 100, the enable signal DfeEn is in the first level value interval, i.e., the enable signal DfeEn is at the high level, at this time, a phase of the second sampling clock signal CLK2 outputted by the NAND gate circuit 114 is inverse to a phase of the fourth sampling clock signal CLK4; when the second sampling clock signal CLK2 is at the low level, the gate of the second PMOS transistor MP2 receives the second sampling clock signal CLK2 at this time and the second PMOS transistor is turned on, to supply the current to the sixth node net 6, moreover, the phase of the first sampling clock signal CLK1 is synchronized with the phase of the second sampling clock signal CLK2, and when the first sampling clock signal CLK1 and the second sampling clock signal CLK2 are both at low levels, the decision feedback equalization module 103 and the first amplification module 101 are both in the operating state, so as to reduce the influence of the ISI on the data receiving circuit 100. When the influence of ISI on the data receiving circuit 100 is not required to be considered, the enable signal DfeEn is in the second level value interval, i.e., the enable signal DfeEn is at the low level, at this time, regardless of whether the fourth sampling clock signal CLK4 is at the high level or the low level, the second sampling clock signal CLK2 outputted by the NAND gate circuit 114 is at the high level, and the gate of the second PMOS transistor MP2 receives the second sampling clock signal CLK2 at this time and is turned off, so that no current is supplied to the sixth node net6, i.e., the decision feedback equalization module 103 is made to be in a non-operating state.

It should be noted that the NAND gate circuit 114 includes only one NAND gate as an example in FIG. 5 and FIG. 8. In practical application, the specific structure of the NAND gate circuit 114 is not limited, and all circuits capable of implementing the NAND gate logic can be NAND gate circuit 114.

In some embodiments, with reference to FIG. 6 and FIG. 7, any one of the first decision feedback unit 113 and the second decision feedback unit 123 includes a switching unit 1131 configured to connect the sixth node net6 and seventh node net7 in response to the feedback signal fb; and an adjusting unit 1132 connected between the seventh node net7 and an output node. The output node is one of the first node n_stg1 and the second node p_stg1, and is configured to adjust a magnitude of an equivalent resistance between the seventh node net7 and the output node in response to a control signal. In the first decision feedback unit 113, if the feedback signal is the first feedback signal fbn, and the output node is the first node n_stg1, the switching unit 1131 responds to the first feedback signal fbn; and in the second decision feedback unit 123, if the feedback signal is the second feedback signal fbp and the output node is the second node p_stg1, the switching unit 1131 responds to the second feedback signal fbp.

The switching unit 1131 in the first decision feedback unit 113 is turned on or turned off based on the first feedback signal fbn and the switching unit 1131 in the second decision feedback unit 123 is turned on or turned off based on the second feedback signal fbp. Regardless of the first decision feedback unit 113 or the second decision feedback unit 123, when the switching unit 1131 is turned on, the adjusting unit 1132 is in an operating state to adjust the voltage at the first node n_stg1 or the second node p_stg1.

In some embodiments, with continued reference to FIG. 6 and FIG. 7, the switching unit 1131 may include a fifth PMOS transistor MP5 connected between the sixth node net6 and the seventh node net7 and having a gate configured to receive the feedback signal fb.

It should be noted that, only the gate of the fifth PMOS transistor MP5 receives the first feedback signal fbn and the output node is the first node n_stg1 as an example in FIG. 6 and FIG. 7. The specific structure of the first decision feedback unit 113 is shown in FIG. 6 and FIG. 7, in practical application, the specific structure of the second decision feedback unit 123 is similar to the specific structure of the first decision feedback unit 113, except that the gate of the fifth PMOS transistor MP5 in the second decision feedback unit 123 receives the second feedback signal fbp, and the output node is the second node p_stg1, which is the same elsewhere.

In one example, if the first feedback signal fbn received by the switching unit 1131 in the first decision feedback unit 113 is at the low level, the fifth PMOS transistor MP5 is turned on and at this time the adjusting unit 1132 adjusts the voltage at the first node n_stg1 based on the control signal. In another example, if the second feedback signal fbp received by the switching unit 1131 in the second decision feedback unit 123 is at the low level, the fifth PMOS transistor MP5 is turned on and at this time the adjusting unit 1132 adjusts the voltage at the second node p_stg1 based on the control signal.

In some embodiments, with continued reference to FIG. 6 and FIG. 7, the adjusting unit 1132 may include multiple transistor groups connected in parallel between the seventh node net7 and the output node. The control terminals of different transistor groups receive different control signals, and different transistor groups have different equivalent resistances. It can be appreciated that, the different equivalent resistances of different transistor groups make the equivalent resistance of the whole adjusting unit 1132 flexible and controllable, and if the control terminals of different transistor groups receive different control signals, the number of transistor groups in the on state can be selected by the control signals to implement the adjustment of the equivalent resistance of the whole adjusting unit 1132, thereby implementing flexible control of the voltage at the first node n_stg1.

In one example, with reference to FIG. 6, the adjusting unit 1132 may include three single MOS transistors connected in parallel between the seventh node net7 and the first node n_stg1, in turn a first MOS transistor M01, a second MOS transistor M02, and a third MOS transistor M03. A gate of the first MOS transistor M01 receives a first control signal DfeTrim <2>, a gate of the second MOS transistor M02 receives a second control signal DfeTrim <1>, and a gate of the third MOS transistor M03 receives a third control signal DfeTrim <0>.

In some embodiments, with reference to FIG. 7, the different transistor groups may include at least one of the transistor groups that includes a single MOS transistor; and at least one of the transistor groups that includes at least two MOS transistors connected in series. In this way, it is possible to adjust the equivalent width-to-length ratio of the channel of a transistor group formed by using multiple individual MOS transistors having a same channel width-to-length ratio and connected in series with each other, so as to realize a diversified design of the adjusting unit 1132. It can be appreciated that different equivalent channel width-to-length ratios of transistor groups can make the equivalent resistances of the transistor group different.

In one example, the adjusting unit may include first transistor groups, a second transistor group and a third transistor group connected in parallel and between the seventh node and the first node. The first transistor group includes a first MOS transistor having a gate configured to receive a first control signal; the second transistor group includes a second MOS transistor having a gate configured to receive a second control signal; the third transistor group includes a third MOS transistor and a fourth MOS transistor connected in series. The a end of the fourth MOS transistor is connected to the seventh node, a second end of the fourth MOS transistor is connected to a first end of the third MOS transistor, and a second end of the third MOS transistor is connected to the first node. The gate of the third MOS transistor and the gate of the fourth MOS transistor both receive the third control signal.

In another example, with reference to FIG. 7, the adjusting unit 1132 may include, in addition to the first transistor group 13, the second transistor group 23, and the third transistor group 33 in the above example, a fourth transistor group 43 and a fifth transistor group 53 connected in parallel and between the seventh node net7 and the first node n_stg1. The first transistor group 13 includes a first MOS transistor M01 having a gate configured to receive a first control signal DfeTrim <2>. The second transistor group 23 includes a second MOS transistor M02 having a gate configured to receive a second control signal DfeTrim <1>. The third transistor group 33 includes a third MOS transistor M03 and a fourth MOS transistor M04 connected in series, the first end of the fourth MOS transistor M04 is connected to the seventh node net7, the second end of the fourth MOS transistor M04 is connected to the first end of the third MOS transistor M03, the second end of the third MOS transistor M03 is connected to the first node n_stg1, and the gate of the third MOS transistor M03 and the gate of the fourth MOS transistor M04 both receive a third control signal DfeTrim <0>. The fourth transistor group 43 includes a fifth MOS transistor M05 having a gate configured to receive a fourth control signal DfePerpin <1>. The fifth transistor group 53 includes a sixth MOS transistor M06 and a seventh MOS transistor M07 connected in series. The first end of the seventh MOS transistor M07 is connected to the seventh node net7, the second end of the seventh MOS transistor M07 is connected to the first end of the sixth MOS transistor M06, and the second end of the sixth MOS transistor M06 is connected to the first node n_stg1. The gates of both the sixth MOS transistor M06 and the seventh MOS transistor M07 receive a fifth control signal DfePerpin <0>.

It should be noted that, in the above three examples, the first control signal DFeTrim <2>, the second control signal DFeTrim <1>, and the third control signal DFeTrim <0> may be shared to all the data receiving circuits 100, that is to say, for different data receiving circuits 100 connected to different DQ ports, the first control signal DFeTrim <2>, the second control signal DFeTrim <1> and the third control signal DFeTrim <0> supplied to the different data receiving circuits 100 are the identical. In addition, in the example shown in FIG. 7, the fourth control signal DFePerPin <1> and the fifth control signal DFePerPin <0> are designed separately for each DQ port. It can be appreciated that, for different data receiving circuits connected to different DQ port, for example, a first data receiving circuit connected to a port DQ1 and a second data receiving circuit connected to a port DQ2, the fourth control signal DFePerpin <1> and the fifth control signal DFePerpin <0> in the first data receiving circuit are designed based on the port DQ1, and the fourth control signal DFePerpin <1> and the fifth control signal DFePerpin <0> in the second data receiving circuit are designed based on the port DQ2. Because the data received by different DQ ports suffer from different ISI, each data signal DQ also suffers from different interference in the transmission path, and different fourth control signals DfePerpin <1> and fifth control signals DfePerpin <0> are individually designed for the data signals DQ received by different DQ port, which facilitates targeted adjustment of each DQ port by the adjusting unit 1132 to further improve reception performance of the data receiving circuit. The DQ port is the port used by the data receiving circuit to receive the data signal DQ.

In the above embodiment, with reference to FIG. 6 and FIG. 7, different transistor groups may include a first transistor group 13, a second transistor group 23 and a third transistor group 33 which are connected in parallel with each other. The equivalent width-to-length ratio of the channel of the first transistor group 13 is twice that of the second transistor group 23, and the equivalent width-to-length ratio of the channel of the second transistor group 23 is twice that of the third transistor group 33. In this way, the ratio of the equivalent resistance of the first transistor group 13, the equivalent resistance of the second transistor group 23 and the equivalent resistance of the third transistor group 33 is 1:2:4, so that the total equivalent resistance of the adjusting unit 1132 can be linearly adjusted, thereby implementing linear adjustment of the voltage at the first node n_stg1 and the voltage at the second node p_stg1.

It should be noted that, it is exemplified that the ratio of the equivalent width-to-length ratio of the channel of the first transistor group 13 to the equivalent width-to-length ratio of the channel of the second transistor group 23 is 2, and the ratio of the equivalent width-to-length ratio of the channel of the second transistor group 23 to the equivalent width-to-length ratio of the channel of the third transistor group 33 is 2, In practical applications, the ratio of the equivalent width-to-length ratio of the channel of the first transistor group 13 to the equivalent width-to-length ratio of the channel of the second transistor group 23, or the ratio of the equivalent width-to-length ratio of the channel of the second transistor group 23 to the equivalent width-to-length ratio of the channel of the third transistor group 33 may also be other values, such as 3 or 4.

It should be noted that, in FIG. 6, the width-to-length ratio of the channel of the first MOS transistor M01 can be controlled to be twice the width-to-length of the channel of the second MOS transistor M02, so that the equivalent width-to-length ratio of the channel of the first transistor group 13 can be realized to be twice the equivalent width-to-length ratio of the channel of the second transistor group 23. The equivalent width-to-length ratio of the channel of the second MOS transistor M02 can be controlled to be twice the width-to-length ratio of the channel of the third MOS transistor M03, so that the equivalent width-to-length ratio of the channel of the second transistor group 23 can be realized to be twice the equivalent width-to-length ratio of the channel of the third transistor group 33. In FIG. 7, the width-to-length ratio of the channel of the first MOS transistor M01 can be controlled to be twice the width-to-length of the channel of the second MOS transistor M02, so that the equivalent width-to-length ratio of the channel of the first transistor group 13 can be realized to be twice the equivalent width-to-length ratio of the channel of the second transistor group 23. The width-to-length ratio of the channel of the second MOS transistor M02, the width-to-length ratio of the channel of the third MOS transistor M03 and the width-to-length ratio of the channel of the fourth MOS transistor M04 are controlled to be equal, so that the width-to-length ratio of the channel of the second MOS transistor M02 is twice the equivalent width-to-length ratio of the channel of the third transistor group 33, that is to say, the equivalent width-to-length ratio of the channel of the second transistor group 23 is twice the equivalent width-to-length ratio of the channel of the third transistor group 33.

In addition, in FIG. 7, the width-to-length ratio of the channel of the fifth MOS transistor M05, the width-to-length ratio of the channel of the sixth MOS transistor M06 and the width-to-length ratio of the channel of the seventh MOS transistor M07 can be controlled to be equal, so that the width-to-length ratio of the channel of the fifth MOS transistor M05 can be realized to be twice the equivalent width-to-length ratio of the channel of the fifth transistor group 53, that is to say, the equivalent width-to-length ratio of the channel of the fourth transistor group 43 is twice the equivalent width-to-length ratio of the channel of the fifth transistor group 53. In some embodiments, the width-to-length ratio of the channel of the fifth MOS transistor M05 may also be equal to the width-to-length ratio of the channel of the second MOS transistor M02.

In one example, with reference to FIG. 6, the length of the channel of the first MOS transistor M01, the length of the channel of the second MOS transistor M02 and the length of the channel of the third MOS transistor M03 may be equal. The width of the channel of the first MOS transistor M01 may be twice the width of the channel of the second MOS transistor M02, and the width of the channel of the second MOS transistor M02 may be twice the width of the channel of the third MOS transistor M03. It should be noted that, in practical application, in a case where the widths of the channels of the first MOS transistor M01, the second MOS transistor M02 and the third MOS transistor M03 are kept to be equal, the ratio relationship of equivalent width-to-length ratio of the channels of the first transistor group 13, the second transistor group 23 and the third transistor group 33 can be implemented by adjusting the ratio relationship of lengths of the channels of the first MOS transistor M01, the second MOS transistor M02 and the third MOS transistor M03, alternatively, by adjusting the ratio relationship of widths of the channels of the first MOS transistor M01, the second MOS transistor M02, and the third MOS transistor M03, and simultaneously adjusting the ratio relationship of lengths of the channels the first MOS transistor M01, the second MOS transistor M02, and the third MOS transistor M03.

It should be noted that the first MOS transistor M01, the second MOS transistor M02, the third MOS transistor M03, the fourth MOS transistor M04, the fifth MOS transistor M05, the sixth MOS transistor M06 and the seventh MOS transistor M07 can all be PMOS transistors or NMOS transistors. When any one of the first MOS transistor M01, the second MOS transistor M02, the third MOS transistor M03, the fourth MOS transistor M04, the fifth MOS transistor M05, the sixth MOS transistor M06 and the seventh MOS transistor M07 is the PMOS transistor, the phase of the control signal for controlling the PMOS transistor in the on state is a first phase. When the MOS transistor is an NMOS transistor, the phase of the control signal for controlling the NMOS transistor in the on state is a second phase. The first phase is inverse to the second phase.

In some embodiments, with reference to FIG. 3 and FIG. 4, the second amplification module 102 may include an input unit connected to the first node n_stg1 and the second node p_stg1, and configured to compare the first voltage signal and the second voltage signal and provide a third voltage signal and a fourth voltage signal respectively to an eighth node n_stg2 and a ninth node p_stg2; and a latch unit 122 configured to amplify and latch the third voltage signal and the fourth voltage signal, output the first output signal Vout to the third node net3 and output the second output signal VoutN to the fourth node net4.

The input unit 112 is configured to compare the first voltage signal and the second voltage signal to output the third voltage signal and the fourth voltage signal. The latch unit 122 is configured to output, according to the third voltage signal and the fourth voltage signal, a high level signal to the third node net3 and a low level signal to the fourth node net4, or the latch unit 122 is configured to output, according to the third voltage signal and the fourth voltage signal, a low level signal to the third node net3 and a high level signal to the fourth node net4.

In some embodiments, with reference to FIG. 5 and FIG. 8, the input unit 112 may include a third NMOS transistor MN3 connected between the eighth node n_stg2 and the ground terminal and having a gate configured to receive the first voltage signal; and a fourth NMOS transistor MN4 connected between the ninth node p_stg2 and the ground terminal, and having a gate configured to receive the second voltage signal.

In one example, when the level value of the first voltage signal outputted by the first node n_stg1 is higher than the level value of the second voltage signal outputted by the second node p_stg1, and the extent of turning on of the third NMOS transistor MN3 is greater than the extent of turning on of the fourth NMOS transistor MN4, so that the voltage at the eighth node n_stg2 is less than the voltage at the ninth node p_stg2, and then the extent of turning on of the fifth NMOS transistor MN5 is greater than the extent of turning on of the sixth NMOS transistor MN6, so that the voltage at the third node net3 is less than the voltage at the fourth node net4. Thus, the extent of turning on of the seventh PMOS transistor MP7 is greater than the extent of turning on of the sixth PMOS transistor MP6, and the latch unit 122 forms a positive feedback amplifier, further making the first output signal Vout outputted by the third node net3 to be at a low level and the second output signal VoutN outputted by the fourth node net4 to be at a high level.

In some embodiments, with continued reference to FIG. 5 and FIG. 8, the latch unit 122 may include a fifth NMOS transistor MN5 connected between the eighth node n_stg2 and the third node net3 and having a gate configured to receive the second output signal VoutN; a sixth NMOS transistor MN6 connected between the ninth node p_stg2 and the fourth node net4 and having a gat configured to receive the first output signal Vout; a sixth PMOS transistor MP6 connected between the power supply node Vcc and the third node net3 and having a gate configured to receive the second output signal VoutN; and a seventh PMOS transistor MP7 connected between the power supply node Vcc and the fourth node net4 and having a gate configured to receive the first output signal Vout.

In some embodiments, with reference to FIG. 3 and FIG. 4, the second amplification module 102 may further include a second reset unit 142 connected to the latch unit 122 and configured to reset the latch unit 122. In this way, after the data receiving circuit completes the reception of the data signal DQ and the reference signal Vref and the output of the first output signal Vout and the second output signal VoutN once, the level values at the third node net3 and the fourth node net4 can be restored to the initial values by the second reset unit 142 so as to facilitate the next data reception and subsequent processing by the data receiving circuit.

In some embodiments, with reference to FIG. 5 and FIG. 8, the second reset unit 142 may include an eighth PMOS transistor MP8 connected between the power supply node Vcc and the third node net3; and a ninth PMOS transistor MP9 is connected between the power supply node Vcc and the fourth node net4. A gate of the eighth PMOS transistor MP8 and a gate of the ninth PMOS transistor MP9 are both responsive to the third sampling clock signal CLK3.

In one example, the phase of the third sampling clock signal CLK3 is inverse to the phase of the first sampling clock signal CLK1, and the third sampling clock signal CLK3 and the fourth sampling clock signal CLK4 may be the same clock signal or different clock signals having the identical phase but different amplitudes. In this way, when it is necessary to reduce the influence of ISI on the data receiving circuit 100, the enable signal DfeEn is in a first level value interval, i.e., the enable signal DfeEn is at the high level, when the first sampling clock signal CLK1 is at a low level, the fourth sampling clock signal CLK4 is at a high level, so that the second sampling clock signal CLK2 is at a low level, the first PMOS transistor MP1 and the second PMOS transistor MP2 are both turned on; at this time, the first NMOS transistor MN1 and the second NMOS transistor MN2 are both turned off, the third sampling clock signal CLK3 is at a high level, and the eighth PMOS transistor MP8 and the ninth PMOS transistor MP9 are both turned off, so as to ensure the normal operation of the data receiving circuit 100. When the influence of ISI on the data receiving circuit 100 is not required to be considered, the enable signal DfeEn is in a second level value interval, i.e., the enable signal DfeEn is at the low level, at this time, regardless of whether the first sampling clock signal CLK1 is at a low level or a high level, the second sampling clock signal CLK2 is at a fixed high level, the second PMOS transistor MP2 is turned off, and no current is supplied to the sixth node net 6, i.e., the decision feedback equalization module 103 stops performing the decision feedback equalization to reduce the overall power consumption of the data receiving circuit 100. In addition, whether or not the influence of ISI on the data receiving circuit 100 needs to be considered, when the first sampling clock signal CLK1 is high, the third sampling clock signal CLK3 is at a low level, and the first PMOS transistor MP1 is turned off, at this time, the first NMOS transistor MN1 and the second NMOS transistor MN2 are both turned on, and the eighth PMOS transistor MP8 and the ninth PMOS transistor MP9 are both turned on, to pull down the voltage at the first node n_stg1 and the voltage at the second node p_stg1, and pull up the voltage at the third node net3 and the voltage at the fourth node net4, so that the reset of the first node n_stg1, the second node p_stg1, the third node net3 and the fourth node net4 can be implemented.

In some embodiments, on the basis that the second reset unit 142 includes the eighth PMOS transistor MP8 and the ninth PMOS transistor MP9, the second reset unit 142 may further include a tenth PMOS transistor (not shown in the figures) connected between the power supply node Vcc and the eighth node n_stg2; and an eleventh PMOS transistor (not shown in the figures) connected between the power supply node Vcc and the ninth node p_stg2. The gate of the tenth PMOS transistor and the gate of the eleventh PMOS transistor both response to the third sampling clock signal CLK3. In this way, when the data receiving circuit 100 does not need to receive the data signal DQ and the reference signal Vref, the third sampling clock signal CLK3 is at a low level, and both the tenth PMOS transistor and the eleventh PMOS transistor are turned on, so that the voltage at the eighth node n_stg2 and the voltage at the ninth node p_stg2 are pulled up to implement the reset of the eighth node n_stg2 and the ninth node p_stg2.

In some embodiments, with reference to FIG. 8, the data receiving circuit 100 (with reference to FIG. 1) may further include an offset compensation module 105 connected to the second amplification module 102 (with reference to FIG. 1) and configured to compensate an offset voltage of the second amplification module 102. Specifically, the offset compensation module 105 may connect to the eighth node n_stg2 and the ninth node p_stg2.

In some embodiments, with continued reference to FIG. 8, the offset compensation module 105 may include a first offset compensation unit 115 connected between the eighth node n_stg2 and the ground terminal; and a second offset compensation unit 125 connected between the ninth node p_stg2 and the ground terminal. The first offset compensation unit 115 is configured to compensate the parameters of the third NMOS transistor MN3; and the second offset compensation unit 125 is configured to compensate the parameters of the fourth NMOS transistor MN4. The first offset compensation unit 115 and the second offset compensation unit 125 can adjust the offset voltage of the data receiving circuit by compensating the parameters of the third NMOS transistor MN3 and the fourth NMOS transistor MN4.

In some embodiments, with continued reference to FIG. 8, the first offset compensation unit 115 may include at least two transistor groups connected in parallel, each transistor group includes a seventh NMOS transistor MN7 having a first end connected to an eighth node n_stg2 and a gate connected to the first node n_stg1; and a seventh MOS transistor M7 arranged in one-to-one correspondence with the seventh NMOS transistor MN7, the seventh MOS transistor M7 is connected between a second end of the seventh NMOS transistor MN7 and the ground terminal, and a gate of the seventh MOS transistor M7 is configured to receive the first mismatch adjustment signal Offset_1. It should be noted that for the sake of simplicity of illustration, only one transistor group in the first offset compensation unit 115 is schematically illustrated in FIG. 8.

In this way, the extent of turning on of the seventh NMOS transistor MN7 can be controlled by the first mismatch adjustment signal Offset_1 to adjust the overall equivalent resistance of the first offset compensation unit 115 to further adjust the voltage at the eighth node n_stg2.

In some embodiments, the first offset compensation unit 115 includes two transistor groups connected in parallel. One of the transistor groups includes a (7-1)-th NMOS transistor (not shown in the figures) and a (7-1)-th MOS transistor (not shown in the figures), and the other of transistor groups includes a (7-2)-th NMOS transistor (not shown in the figures) and a (7-2)-th MOS transistor (not shown in the figures). The first mismatch adjustment signal Offset_1 includes a third mismatch adjustment signal (not shown in the figures) and a fourth mismatch adjustment signal (not shown in the figures), a gate of the (7-1)-th NMOS transistor and a gate of the (7-2)-th NMOS transistor are connected to the first node n_stg1, a gate of the (7-1)-th MOS transistor is configured to receive the third mismatch adjustment signal, and a gate of the (7-2)-th MOS transistor is configured to receive the fourth mismatch adjustment signal.

The third mismatch adjustment signal and the fourth mismatch adjustment signal may be different. In this way, the extent of turning on of the (7-1)-th NMOS transistor and/or the extent of turning on of the (7-2)-th MOS transistor can be controlled based on the third mismatch adjustment signal and the fourth mismatch adjustment signal, to flexibly adjust the overall equivalent resistance of the first offset compensation unit 115 and improve the adjustment effect for the voltage at the eighth node n_stg2.

In some embodiments, with reference to FIG. 5, the second offset compensation unit 125 may include at least two transistor groups connected in parallel, each transistor group includes an eighth NMOS transistor MN8 having a first end connected to a ninth node p_stg2 and a gate connected to a second node p_stg1; and an eighth MOS transistor M8 arranged in one-to-one correspondence with an eighth NMOS transistor M8, the eighth MOS transistor M8 is connected between a second end of the eighth NMOS transistor MN8 and the ground terminal, and a gate of the eighth MOS transistor M8 is configured to receive a second mismatch adjustment signal Offset_2. It should be noted that for the sake of simplicity of illustration, only one transistor group in the second offset compensation unit 125 is schematically illustrated in FIG. 5.

In this way, the extent of turning on of the eighth NMOS transistor MN8 can be controlled by the second mismatch adjustment signal Offset_2 to adjust the overall equivalent resistance of the second offset compensation unit 125 to further adjust the voltage at the ninth node p_stg2.

In some embodiments, the second offset compensation unit 125 includes two transistor groups connected in parallel. One of transistor groups includes an (8-1)-th NMOS transistor (not shown in the figures) and an (8-1)-th MOS transistor (not shown in the figures), and the other of transistor groups includes an (8-2)-th NMOS transistor (not shown in the figures) and an (8-2)-th MOS transistor (not shown in the figures). The second mismatch adjustment signal Offset_2 includes a fifth mismatch adjustment signal (not shown in the figures) and a sixth mismatch adjustment signal (not shown in the figures), a gate of the (8-1)-th NMOS transistor and a gate of the (8-2)-th NMOS transistor are connected to the first node n_stg1, a gate of the (8-1)-th MOS transistor is configured to receive the fifth mismatch adjustment signal, and a gate of the (8-2)-th MOS transistor is configured to receive the sixth mismatch adjustment signal.

The fifth mismatch adjustment signal and the sixth mismatch adjustment signal may be different. In this way, the extent of turning on of the (8-1)-th NMOS transistor and/or the extent of turning on of the (8-2)-th MOS transistor can be controlled based on the fifth mismatch adjustment signal and the sixth mismatch adjustment signal, to flexibly adjust the overall equivalent resistance of the second offset compensation unit 125 and improve the adjustment effect for the voltage at the ninth node p_stg2.

It should be noted that the seventh MOS transistor M7, the (7-1)-th MOS transistor, the (7-2)-th MOS transistor, the eighth MOS transistor M8, the (8-1)-th MOS transistor and the (8-2)-th MOS transistor can all be PMOS transistors or NMOS transistors. When any MOS transistor is a PMOS transistor, the phase of the first mismatch adjustment signal Offset_1 for controlling the PMOS transistor to be turned on is a third phase; when the MOS transistor is an NMOS transistor, the phase of the second mismatch adjustment signal Offset_2 for controlling the NMOS transistor to be turned on is a fourth phase. The third phase is inverse to the fourth phase.

It should be noted that in the above description of the high level and the low level, the high level may have a level value greater than or equal to the level value of the power supply voltage, and the low level may have a level value less than or equal to the level value of the ground voltage. Moreover, the high level and the low level are relative, and the specific level value ranges included in the high level and the low level can be determined according to the specific device. For example, for an NMOS transistor, the high level refers to the level value range of the voltage of the gate that enables the NMOS transistor to be turned on, and the low level refers to the level value range of the voltage of the gate that enables the NMOS transistor to be turned off. For a PMOS transistor, a low level refers to a level value range of the voltage of the gate that enables the PMOS transistor to be turned on, and a high level refers to a level value range of the voltage of the gate that enables the PMOS transistor to be turned off.

In view of above, the decision feedback control module 104 is configured to generate a second sampling clock signal CLK2 for controlling the decision feedback equalization module 103, so as to flexibly control whether the decision feedback equalization module 103 is to be in an operating state. For example, when it is necessary to reduce the influence of ISI on the data receiving circuit 100, i.e., when the enable signal DfeEn is in the first level value interval, the decision feedback control module 104 generates the second sampling clock signal CLK2 in response to the enable signal DfeEn at this time, and the decision feedback equalization module 103 performs decision feedback equalization based on the second sampling clock signal CLK2, so as to improve the reception performance of the data receiving circuit 100. When the influence of the ISI on the data receiving circuit 100 is not required to be considered, i.e., when the enable signal DfeEn is in the second level value interval, the decision feedback equalization module 103 stops, based on the second sampling clock signal CLK2 at this time, performing the decision feedback equalization, so as to reduce the overall power consumption of the data receiving circuit 100. In this way, it is possible to facilitate improving the reception performance of the data receiving circuit 100 and simultaneously reducing the overall power consumption of the data receiving circuit 100.

Figure 2:
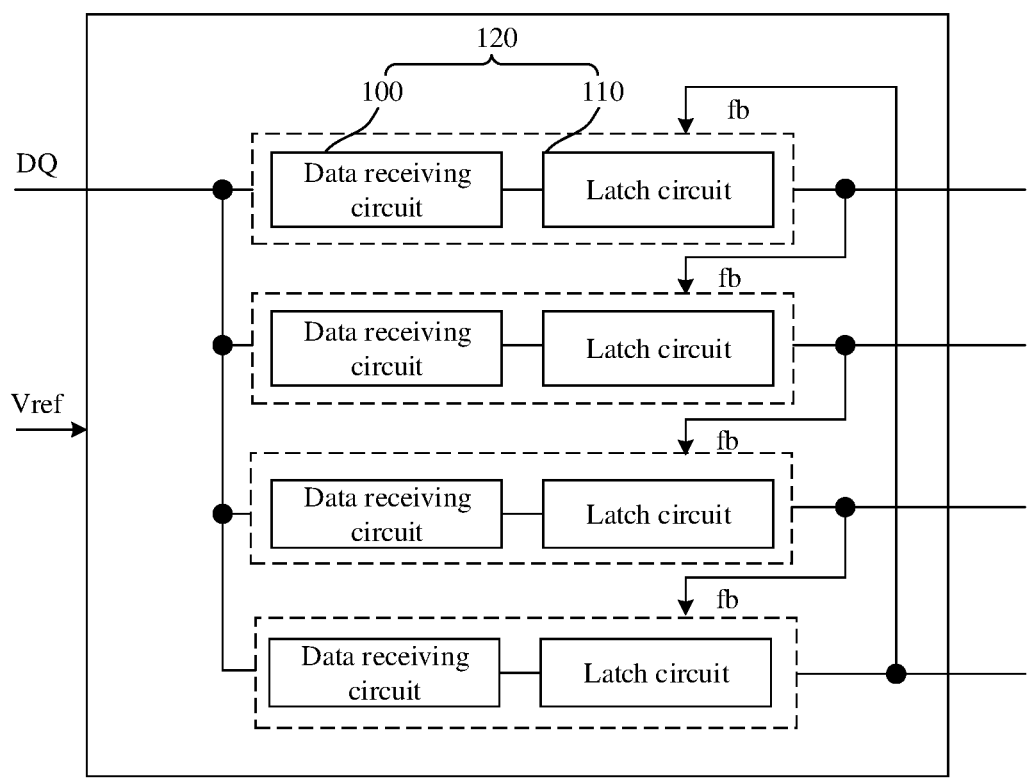
FIG. 2 is a functional block diagram of a data receiving system according to another embodiment of the present disclosure.

Another embodiment of the present disclosure also provides a data receiving system, which will be described in detail below with reference to the accompanying drawings. FIG. 2 is a functional block diagram of a data receiving system according to another embodiment of the present disclosure.

With reference to FIG. 2, the data receiving system includes multiple cascaded stages of data transmission circuits 120. Each of the data transmission circuits 120 includes the data receiving circuit 100 as in the embodiments of the present disclosure and a latch circuit 110 connected to the data receiving circuit 100, each of the data receiving circuits 100 connected to a data port to receive a data signal DQ; the data transmission circuit 120 of a preceding stage is connected to the decision feedback equalization module 103 of the data transmission circuit 120 (with reference to FIG. 1) of a following stage, and the output of the data transmission circuit 120 of the preceding stage serves as a feedback signal fb of the decision feedback equalization module 130 of the data transmission circuit 120 the following stage; and the data transmission circuit 120 of a last stage is connected to the decision feedback equalization module 103 of the data transmission circuit 120 of a first stage, and an output of the data transmission circuit 120 of the last stage serves as a feedback signal fb of the decision feedback equalization module 103 of the data transmission circuit 120 of the first stage.

The latch circuit 110 is arranged in one-to-one correspondence with the data receiving circuit 100, and the latch circuit 110 is configured to latch and output a signal outputted by the data receiving circuit 100 corresponding to the latch circuit 110.

In some embodiments, the data receiving circuit 100 is configured to receive data in response to the sampling clock signal; and the data receiving system includes four cascaded stages of data receiving circuits 100, and the phase difference of sampling clock signals of the data receiving circuits 100 of adjacent stages is 90 degrees. In this way, the period of sampling the clock signal is twice the period of the data signal DQ received by the data port, which is beneficial to clock wiring and power consumption saving.

It should be noted that, the data receiving system includes four cascaded stages of the data receiving circuits 100, and the phase difference of the sampling clock signals of the data receiving circuits 100 of the adjacent stages is 90 degrees as an example, In practical application, the number of cascaded stages of the data receiving circuits 100 included in the data receiving system is not limited, and the phase difference of sampling clock signals of data receiving circuits 100 of adjacent stages can be reasonably set based on the number of cascaded stages of the data receiving circuits 100.

In some embodiments, the decision feedback equalization module 103 of the data receiving circuit 100 of the current stage is connected to the output of the second amplification module 102 of the data receiving circuit 100 of the previous stage, and the first output signal Vout and the second output signal VoutN outputted by the second amplification module 102 of the data receiving circuit 100 of the preceeding stage serve as the feedback signal fb of the data receiving circuit 100 of the following stage. In this way, the output of the data receiving circuit 100 is directly transmitted to the data transmission circuit 120 of the following stage without passing through the latch circuit 110, which facilitates the reduction of the data transmission delay.

In other embodiments, the decision feedback equalization module 103 of the data receiving circuit 100 of the current stage is connected to the output of the latch circuit 110 of the previous stage, and the signal outputted by the latch circuit 110 of the proceeding stage serves as the feedback signal fb of the data receiving circuit 100 of the following stage.

In view of above, according to the data receiving system provided by another embodiment of the present disclosure, the decision feedback control module 104 is configured to generate the second sampling clock signal CLK2 for controlling the decision feedback equalization module 103, so as to flexibly control whether the decision feedback equalization module 103 is to be in an operating state. For example, when it is necessary to reduce the influence of ISI on the data receiving circuit 100, the decision feedback equalization module 103 performs decision feedback equalization based on the second sampling clock signal CLK2 to improve the reception performance of the data receiving circuit 100. When the influence of the ISI on the data receiving circuit 100 is not required to be considered, the decision feedback equalization module 103 stops, based on the second sampling clock signal CLK2, performing the decision feedback equalization, to reduce the overall power consumption of the data receiving circuit 100.

Another embodiment of the present disclosure also provides a storage device including multiple data ports; multiple data receiving systems as provided in another embodiment of the present disclosure, and each data receiving system corresponds to one data port.

In this way, when it is necessary to reduce the influence of ISI on the storage device, each data port in the storage device can flexibly adjust the received data signal DQ through the data receiving system, and improve the adjustment capability for the first output signal Vout and the second output signal VoutN, thereby improving the reception performance of the storage device. When the influence of the ISI is not required to be considered, the decision feedback equalization module 103 stops, based on the second sampling clock signal CLK2, performing the decision feedback equalization, to reduce the power consumption of the storage device.

In some embodiments, the storage device may be double date rate (DDR) memory, such as DDR4 memory, DDR5 memory, DDR6 memory, low power DDR4 (LPDDR4) memory, LPDDR5 memory, or LPDDR6 memory.

Those of ordinary skill in the art will appreciate that the above-described embodiments are specific embodiments implementing the present disclosure and that in practical application various changes in form and detail may be made thereto without departing from the spirit and scope of the present disclosure. Those skilled in the art may make respective alterations and modifications without departing from the spirit and scope of the present disclosure, so the protection scope of the disclosure is subject to the protection scope in claims.

The invention claimed is:

1. A data receiving circuit, comprising:
   a first amplification module, configured to receive a data signal and a reference signal, compare the data signal and the reference signal in response to a first sampling clock signal, and output a first voltage signal and a second voltage signal respectively through a first node and a second node;
   a decision feedback control module, configured to generate a second sampling clock signal in response to an enable signal;
   a decision feedback equalization module, connected to the first node and the second node, wherein the decision feedback equalization module is configured to, when the enable signal is in a first level value interval, perform decision feedback equalization in response to the second sampling clock signal and based on a feedback signal to adjust the first voltage signal and the second voltage signal, and stop performing the decision feedback equalization when the enable signal is in a second level value interval, the feedback signal being obtained based on previously received data; and
   a second amplification module, configured to amplify a voltage difference between the first voltage signal and the second voltage signal, and output a first output signal and a second output signal respectively through a third node and a fourth node.

2. The data receiving circuit of claim 1, wherein the first amplification module comprises:
   a first current source, configured to be connected between a power supply node and a fifth node to supply current to the fifth node in response to the first sampling clock signal; and
   a comparison unit, connected to the fifth node, the first node and the second node, wherein the comparison unit is configured to receive the data signal and the reference signal, compare the data signal and the reference signal when the first current source supplies the current to the fifth node in response to the first sampling clock signal, output the first voltage signal through the first node, and output the second voltage signal through the second node.

3. The data receiving circuit of claim 2, wherein the first current source comprises:
   a first Positive-Channel-Metal-Oxide-Semiconductor (PMOS) transistor, connected between the power supply node and the fifth node, and having a gate configured to receive the first sampling clock signal.

4. The data receiving circuit of claim 2, wherein the comparison unit comprises:
   a third Positive-Channel-Metal-Oxide-Semiconductor (PMOS) transistor, connected between the fifth node and the first node, and having a gate configured to receive the data signal; and
   a fourth PMOS transistor, connected between the fifth node and the second node, and having a gate configured to receive the reference signal.

5. The data receiving circuit of claim 2, wherein the first amplification module further comprises:
   a first reset unit, connected to the first node and the second node and configured to reset the first node and the second node.

6. The data receiving circuit of claim 5, wherein the first reset unit comprises:
  a first Negative-Channel-Metal-Oxide-Semiconductor (NMOS) transistor, connected between the first node and a ground terminal, and having a gate configured to receive the first sampling clock signal; and
  a second NMOS transistor, connected between the second node and the ground terminal, and having a gate configured to receive the first sampling clock signal.

7. The data receiving circuit of claim 1, wherein the feedback signal comprises a first feedback signal and a second feedback signal that are differential signals to each other; and the decision feedback equalization module comprises:
  a second current source, connected between a power supply node and a sixth node to supply current to the sixth node in response to the second sampling clock signal;
  a first decision feedback unit, connected to the first node and the sixth node and configured to perform decision feedback equalization on the first node based on the first feedback signal to adjust the first voltage signal, when the second current source supplies current to the sixth node in response to the second sampling clock signal; and
  a second decision feedback unit, connected to the second node and the sixth node and configured to perform decision feedback equalization on the second node based on the second feedback signal to adjust the second voltage signal, when the second current source supplies the current to the sixth node in response to the second sampling clock signal.

8. The data receiving circuit of claim 7, wherein the second current source comprises:
  a second Positive-Channel-Metal-Oxide-Semiconductor (PMOS) transistor, connected between the power supply node and the sixth node, and having a gate configured to receive the second sampling clock signal.

9. The data receiving circuit of claim 7, wherein any one of the first decision feedback unit and the second decision feedback unit comprises:
  a switching unit, configured to connect the sixth node and a seventh node in response to the feedback signal; and
  an adjusting unit, connected between the seventh node and an output node, wherein the output node is one of the first node and the second node, and is configured to adjust a magnitude of an equivalent resistance between the seventh node and the output node in response to a control signal,
  wherein in the first decision feedback unit, when the feedback signal is the first feedback signal and the output node is the first node, the switching unit responds to the first feedback signal; and in the second decision feedback unit, when the feedback signal is the second feedback signal and the output node is the second node, the switching unit responds to the second feedback signal.

10. The data receiving circuit of claim 9, wherein the switching unit comprises:
  a fifth Positive-Channel-Metal-Oxide-Semiconductor (PMOS) transistor, connected between the sixth node and the seventh node, and having a gate configured to receive the feedback signal.

11. The data receiving circuit of claim 9, wherein the adjusting unit comprises:
  a plurality of transistor groups connected in parallel between the seventh node and the output node, wherein control terminals of different transistor groups receive different control signals, and different transistor groups have different equivalent resistances.

12. The data receiving circuit of claim 11, wherein the different transistor groups comprise:
  at least one of the transistor groups that comprises a single Metal-Oxide-Semiconductor (MOS) transistor; and
  at least one of the transistor groups that comprises at least two MOS transistors connected in series.

13. The data receiving circuit of claim 1, wherein the second amplification module comprises:
  an input unit, connected to the first node and the second node, and configured to compare the first voltage signal and the second voltage signal and provide a third voltage signal and a fourth voltage signal respectively to an eighth node and a ninth node; and
  a latch unit, configured to amplify and latch the third voltage signal and the fourth voltage signal, output the first output signal to the third node and output the second output signal to the fourth node.

14. The data receiving circuit of claim 13, wherein the input unit comprises:
  a third Negative-Channel-Metal-Oxide-Semiconductor (NMOS) transistor, connected between the eighth node and a ground terminal, and having a gate configured to receive the first voltage signal; and
  a fourth NMOS transistor, connected between the ninth node and the ground terminal, and having a gate configured to receive the second voltage signal.

15. The data receiving circuit of claim 13, wherein the latch unit comprises:
  a fifth Negative-Channel-Metal-Oxide-Semiconductor (NMOS) transistor, connected between the eighth node and the third node, and having a gate configured to receive the second output signal;
  a sixth NMOS transistor, connected between the ninth node and the fourth node, and having a gate configured to receive the first output signal;
  a sixth Positive-Channel-Metal-Oxide-Semiconductor (PMOS) transistor, connected between a power supply node and the third node, and having a gate configured to receive the second output signal; and
  a seventh PMOS transistor, connected between the power supply node and the fourth node, and having a gate configured to receive the first output signal.

16. The data receiving circuit of claim 13, wherein the second amplification module further comprises:
  a second reset unit, connected to the latch unit and configured to reset the latch unit.

17. The data receiving circuit of claim 16, wherein the second reset unit comprises:
  an eighth Positive-Channel-Metal-Oxide-Semiconductor (PMOS) transistor, connected between a power supply node and the third node; and
  a ninth PMOS transistor, connected between the power supply node and the fourth node, wherein a gate of the eighth PMOS transistor and a gate of the ninth PMOS transistor are both responsive to a third sampling clock signal.

18. The data receiving circuit of claim 1, wherein the decision feedback control module comprises:
  a NAND gate circuit, having one input terminal configured to receive a fourth sampling clock signal, the other input terminal configured to receive the enable signal, and an output terminal configured to output the second sampling clock signal.

19. A data receiving system, comprising:
a plurality of cascaded stages of data transmission circuits, wherein each of the data transmission circuits comprises the data receiving circuit of claim 1 and a latch circuit connected to the data receiving circuit, each of the data receiving circuits is connected to a data port to receive the data signal; and the data transmission circuit of a preceding stage is connected to the decision feedback equalization module of the data transmission circuit of a following stage, and an output of the data transmission circuit of the preceding stage serves as a feedback signal of the decision feedback equalization module of the data transmission circuit of the following stage; and the data transmission circuit of a last stage is connected to the decision feedback equalization module of the data transmission circuit of a first stage, and an output of the data transmission circuit of the last stage serves as a feedback signal of the decision feedback equalization module of the data transmission circuit of the first stage.

20. A storage device, comprising:
a plurality of data ports; and
a plurality of data receiving systems of claim 19, each of the data receiving systems corresponding to a respective one of the data ports.

* * * * *